(12) United States Patent
Lane et al.

(10) Patent No.: US 6,175,146 B1
(45) Date of Patent: *Jan. 16, 2001

(54) SEMICONDUCTOR PROCESSING METHODS OF FORMING INTEGRATED CIRCUITRY MEMORY DEVICES, METHODS OF FORMING CAPACITOR CONTAINERS, METHODS OF MAKING ELECTRICAL CONNECTION TO CIRCUIT NODES AND RELATED INTEGRATED CIRCUITRY

(75) Inventors: Richard H. Lane; John K. Zahurak, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/970,345

(22) Filed: Nov. 14, 1997

Related U.S. Application Data

(62) Division of application No. 08/816,621, filed on Mar. 13, 1997, now Pat. No. 5,998,257.

(51) Int. Cl.[7] .................................................. H01L 23/58
(52) U.S. Cl. .................... 257/635; 257/636; 257/308; 257/309; 257/412; 257/417; 257/217; 257/235; 257/249; 257/250; 257/254; 257/755; 257/768
(58) Field of Search ................................. 257/635, 308, 257/309, 656, 412, 413, 217, 235, 249, 250, 754, 755, 768

(56) References Cited

U.S. PATENT DOCUMENTS

| | | | |
|---|---|---|---|
| 5,170,233 | * 12/1992 | Liu et al. | 257/308 |
| 5,206,183 | 4/1993 | Dennison . | |
| 5,227,325 | * 7/1993 | Gonzales | 437/52 |

(List continued on next page.)

OTHER PUBLICATIONS

U.S. application No. 07/869,615, Doan et al., filed Apr. 16, 1992.
U.S. application No. 08/044,824, Dennison et al., filed Apr. 7, 1993.
U.S. application No. 08/078,616, abandoned, Lee et al., filed Jun. 17, 1993.

(List continued on next page.)

*Primary Examiner*—David Hardy
*Assistant Examiner*—Matthew E. Warren
(74) *Attorney, Agent, or Firm*—Wells, St. John, Roberts, Gregory & Matkin P.S.

(57) ABSTRACT

In one aspect, the invention provides a method of forming an integrated circuitry memory device. In one preferred implementation, a conductive layer is formed over both memory array areas and peripheral circuitry areas. A refractory metal layer is formed over the conductive layer to provide conductive structure in both areas. According to a preferred aspect of this implementation, the conductive layer which is formed over the memory array provides an electrical contact for a capacitor container to be formed. According to another preferred aspect of this implementation, the conductive layer formed over the peripheral circuitry area constitutes a conductive line which includes at least some of the silicide. In another preferred implementation, the invention provides a method of forming a capacitor container over a substrate. According to a preferred aspect of this implementation, a conductive layer is elevationally interposed between an upper insulating layer and a lower conductive layer over the substrate. The upper insulating layer is etched relative to the interposed conductive layer to form a capacitor container first portion. Subsequently, the interposed conductive layer is etched to form a capacitor container second portion.

22 Claims, 8 Drawing Sheets

U.S. PATENT DOCUMENTS

| | | |
|---|---|---|
| 5,229,326 | 7/1993 | Dennison et al. . |
| 5,244,826 | 9/1993 | Gonzalez et al. . |
| 5,318,927 | 6/1994 | Sandhu et al. . |
| 5,323,038 | 6/1994 | Gonzalez et al. . |
| 5,338,700 | 8/1994 | Dennison et al. . |
| 5,391,511 | 2/1995 | Doan et al. . |
| 5,401,681 | 3/1995 | Dennison . |
| 5,438,011 | 8/1995 | Blalock et al. . |
| 5,444,013 | 8/1995 | Akram et al. . |
| 5,506,166 | 4/1996 | Sandhu et al. . |
| 5,538,922 * | 7/1996 | Cooper et al. ............... 437/195 |
| 5,563,089 | 10/1996 | Jost et al. . |
| 5,581,093 * | 12/1996 | Sakamoto ..................... 257/67 |
| 5,600,177 * | 2/1997 | Yamazaki ..................... 257/588 |
| 5,604,147 | 2/1997 | Fischer et al. . |
| 5,605,857 | 2/1997 | Jost et al. . |
| 5,610,101 * | 3/1997 | Koyama ....................... 437/195 |
| 5,661,064 | 8/1997 | Figura et al. . |
| 5,665,626 * | 9/1997 | Cronin ......................... 438/396 |
| 5,677,227 * | 10/1997 | Yang et al. ................... 437/60 |
| 5,688,713 * | 11/1997 | Linliu et al. .................. 437/60 |
| 5,706,164 * | 1/1998 | Jeng ............................. 361/321.4 |
| 5,717,250 * | 2/1998 | Schuele ........................ 257/754 |
| 5,786,249 | 7/1998 | Dennison . |
| 5,851,891 | 12/1998 | Summerfelt . |
| 5,905,280 | 5/1999 | Liu et al. . |
| 5,918,122 | 6/1999 | Parekh et al. . |
| 5,981,333 | 11/1999 | Parekh et al. . |

OTHER PUBLICATIONS

U.S. application No. 08/163,439, abandoned, Dennison, filed Dec. 7, 1993.

U.S. application No. 08/582,385, Sandhu et al., filed Jan. 3, 1996.

U.S. application No. 08/622,591, Dennison, filed Mar. 26, 1996.

U.S. application No. 08/798,242, Parekh et al., filed Feb. 11, 1997.

U.S. application No. 08/798,251, Parekh, filed Feb. 11, 1997.

* cited by examiner

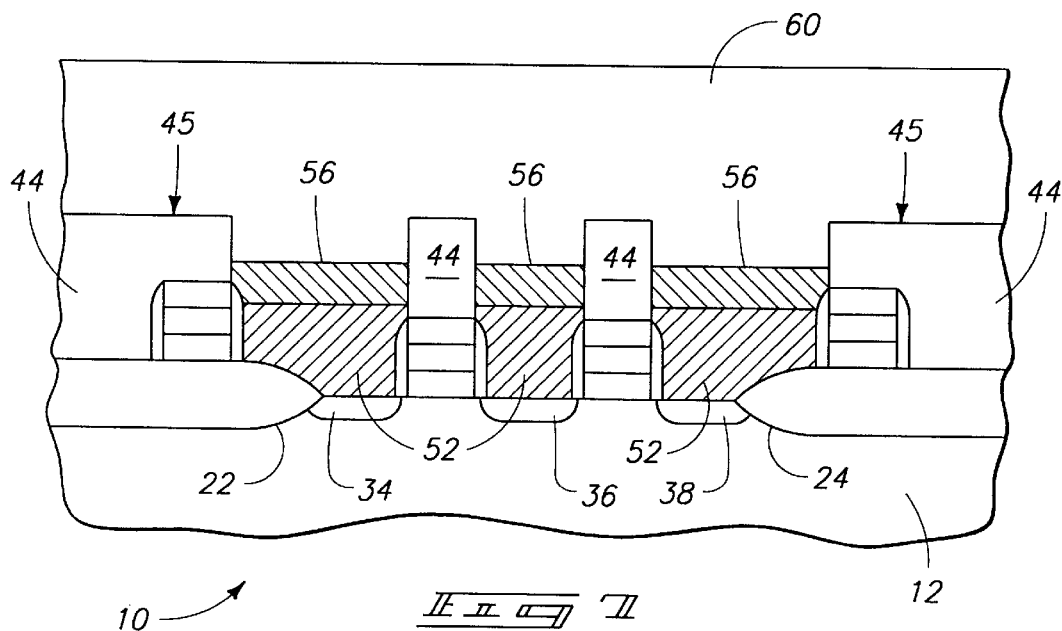
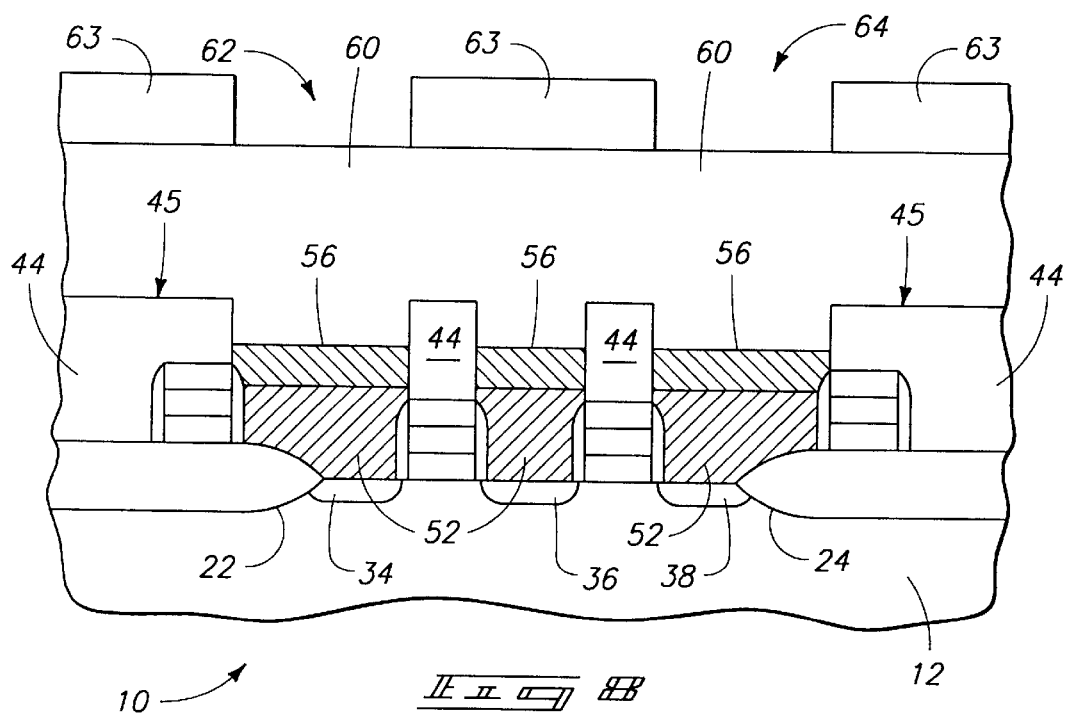

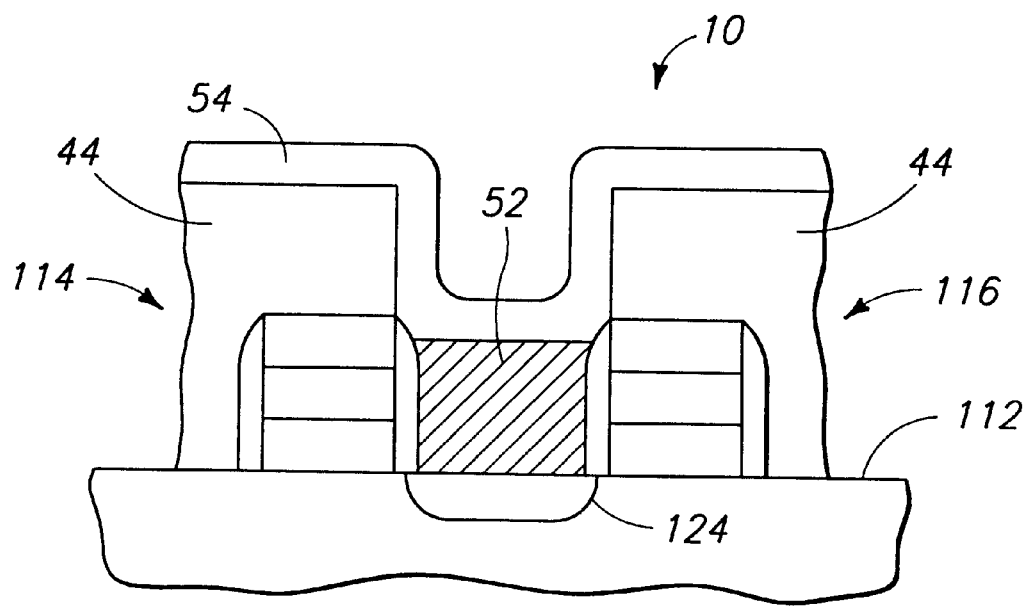
_FIG_ 12
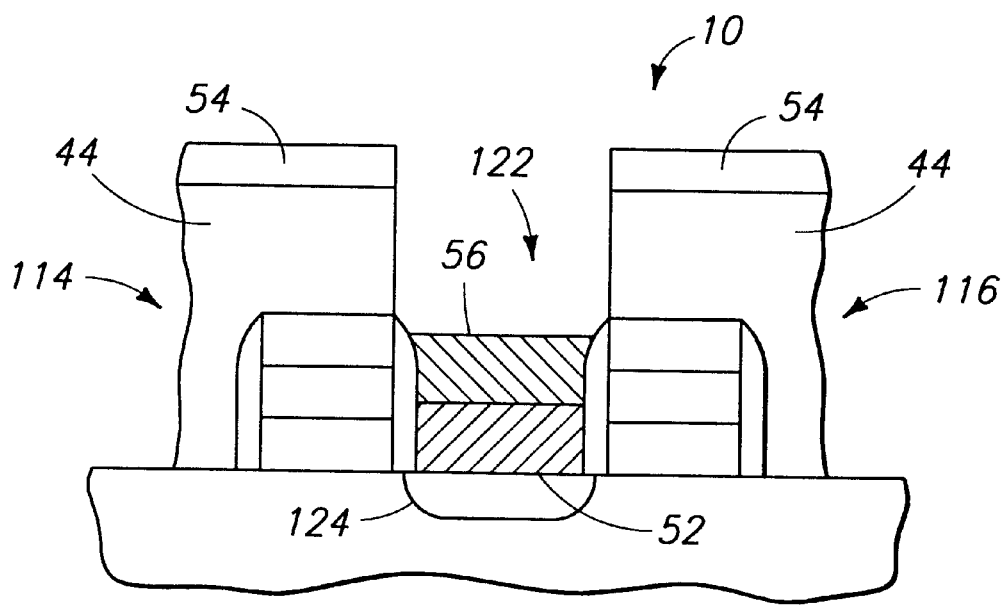
_FIG_ 13

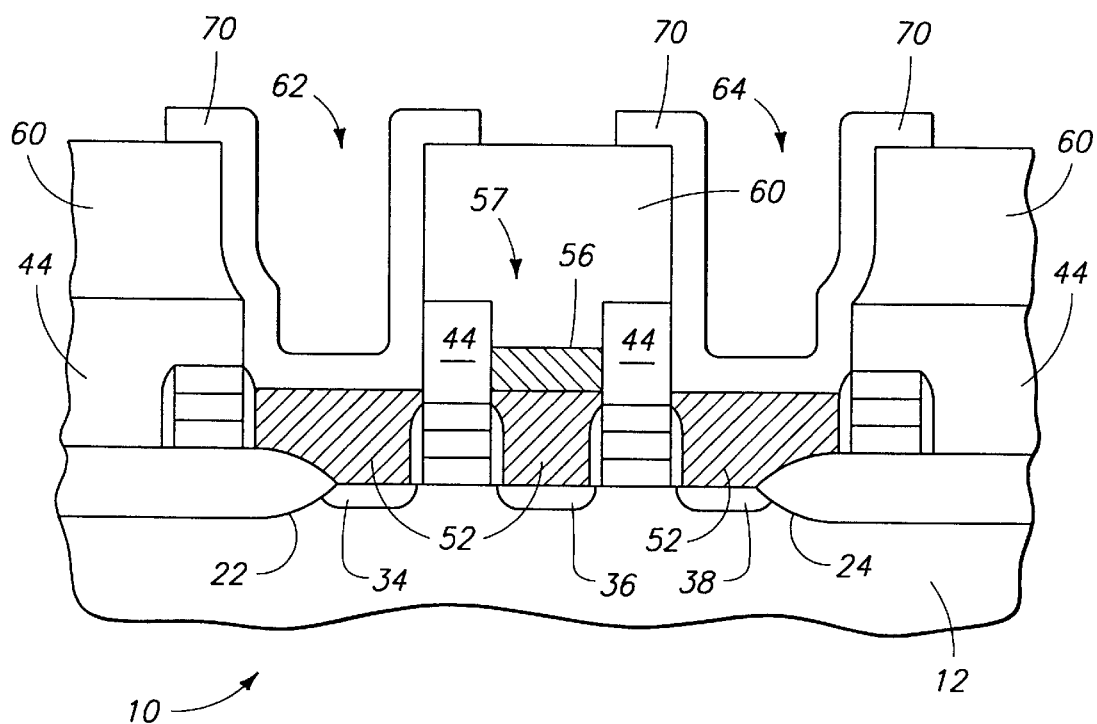

SEMICONDUCTOR PROCESSING METHODS OF FORMING INTEGRATED CIRCUITRY MEMORY DEVICES, METHODS OF FORMING CAPACITOR CONTAINERS, METHODS OF MAKING ELECTRICAL CONNECTION TO CIRCUIT NODES AND RELATED INTEGRATED CIRCUITRY

RELATED PATENT DATA

This patent resulted from a divisional application of U.S. patent application Ser. No. 08/816,621, filed Mar. 13, 1997, entitled "Semiconductor Processing Methods of Forming Integrated Circuitry Memory Devices, Methods of Forming Capacitor Containers, Methods of Making Electrical Connection to Circuit Nodes and Related Integrated Circuitry", naming Richard H. Lane and John K. Zahurak as inventors, and which is now U.S. Pat. No. 5,998,257.

TECHNICAL FIELD

This invention relates to semiconductor processing methods of forming integrated circuitry memory devices, methods of forming capacitor containers, methods of making electrical connection to circuit nodes and related integrated circuitry.

BACKGROUND OF THE INVENTION

Integrated memory devices typically include a memory array area and a peripheral circuitry area. The memory array area constitutes the area in which information or data is stored. The peripheral circuitry area constitutes integrated circuitry which, in part, controls or provides access to the memory array area. One type of integrated memory device is a dynamic random access memory (DRAM) device. DRAMs include, as part of the memory array, plural capacitors which are used to store charges. It is desirable to fabricate integrated circuitry memory devices to have fairly close, comparable, and repeatable capacitance values.

Stacked DRAM capacitors are typically formed from a plurality of layers provided over a substrate by etching at least some of the layers to form a desired capacitor container construction. Capacitors are thereafter formed in the etched containers. To increase the capacitance values of the subsequently formed capacitors, a timed etch is typically conducted to further etch the provided layers after an initial capacitor container definition etch is conducted. Such timed etches can be problematic for a number of reasons. For example, such etches must be carefully monitored and timed to ensure that the etch does not undesirably extend into adjacent integrated device components, which can destroy the circuit. Thus, control of the etches is of major concern. Another problem is that reproducibility of the depth of such etches can be difficult to attain given variations in the processing regimes and materials used to fabricate the capacitor containers. Thus, a need exists for semiconductor processing methods which enable memory devices to be fabricated with predictable and readily reproducible capacitance values.

Another problem associated with the fabrication of integrated memory devices concerns forming electrical connections between conductive lines and substrate active areas in peripheral circuitry areas of the memory array. More specifically, it is sometimes desirable for conductive lines to be electrically connected with substrate active areas which are disposed elevationally lower over a substrate than the respective conductive lines. Typically, the elevational separation between the conductive lines and the substrate active area is due to one or more layers which are interposed between the conductive lines and the corresponding active area to which electrical connection is desired. Often such conductive lines do not typically directly overlie the entire active area with which electrical connection is desired. One prior art solution is to provide a conductive plug of material which extends generally vertically between and connects with the overlying conductive line and only a portion of the active area with which electrical connection is desired. This, however, gives rise to increased resistance and hence lower conductivity as between the conductive line and the elevationally lower substrate active area. Thus, a need exists to provide improved semiconductor processing methods and related integrated circuitry formed thereby with improved conductive connections between elevationally separated conductive lines and substrate active areas.

This invention arose out of concerns associated with forming integrated memory circuitry, particularly DRAM memory devices, with standardized and readily reproducible component values, as well as improving conductive connections between the memory device components.

SUMMARY OF THE INVENTION

In one aspect, the invention provides a method of forming an integrated circuitry memory device. In one preferred implementation, a conductively doped layer is formed over both memory array areas and peripheral circuitry areas. A refractory metal layer is formed over the conductively doped layer to provide conductive structure in both areas. According to a preferred aspect of this implementation, the conductively doped layer which is formed over the memory array provides an electrical contact for a capacitor container to be formed. According to another preferred aspect of this implementation, the conductively doped layer formed over the peripheral circuitry area constitutes a conductive line which includes at least some of the silicide.

In another preferred implementation, the invention provides a method of forming a capacitor container over a substrate. According to a preferred aspect of this implementation, a conductive layer is elevationally interposed between an upper insulating layer and a lower conductive layer over the substrate. The upper insulating layer is etched relative to the interposed conductive layer to form a capacitor container first portion. Subsequently, the interposed conductive layer is etched to form a capacitor container second portion. Preferably, the first etch is substantially selective relative to the interposed conductive layer. Additionally, the second etch is preferably substantially selective relative to the lower conductive layer.

According to another preferred implementation, the invention provides a method of forming capacitor containers. According to a preferred implementation, at least three layers of different materials are formed over a substrate and subsequently etched to form a desired capacitor container. According to a preferred aspect, a first of the materials is etched using a first etching composition which outwardly exposes at least some of a second of the materials. Preferably, such exposure is detected whereupon the first etching composition is changed to a second etching composition which is different from the first etching composition. Accordingly, and utilizing the second etching composition, the second of the materials is etched to outwardly expose at least some of a third of the materials.

BRIEF DESCRIPTION OF THE DRAWINGS

Preferred embodiments of the invention are described below with reference to the following accompanying drawings.

FIG. 7 is a cross-sectional view of the FIG. 1 semiconductor wafer fragment at a processing step subsequent to that shown by FIG. 6.

FIG. 8 is a cross-sectional view of the FIG. 1 semiconductor wafer fragment at a processing step subsequent to that shown by FIG. 7.

FIG. 12 is a view along line 12—12 in FIG. 11 and corresponds to the FIG. 5 processing step.

FIG. 13 is view of the FIG. 12 peripheral circuitry area fragmentary portion at a processing step subsequent to that shown by FIG. 12, and one which corresponds to the FIG. 6 processing step.

FIG. 14 is a cross-sectional view of the FIG. 1 semiconductor wafer fragment at a processing step subsequent to that shown by FIG. 10.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
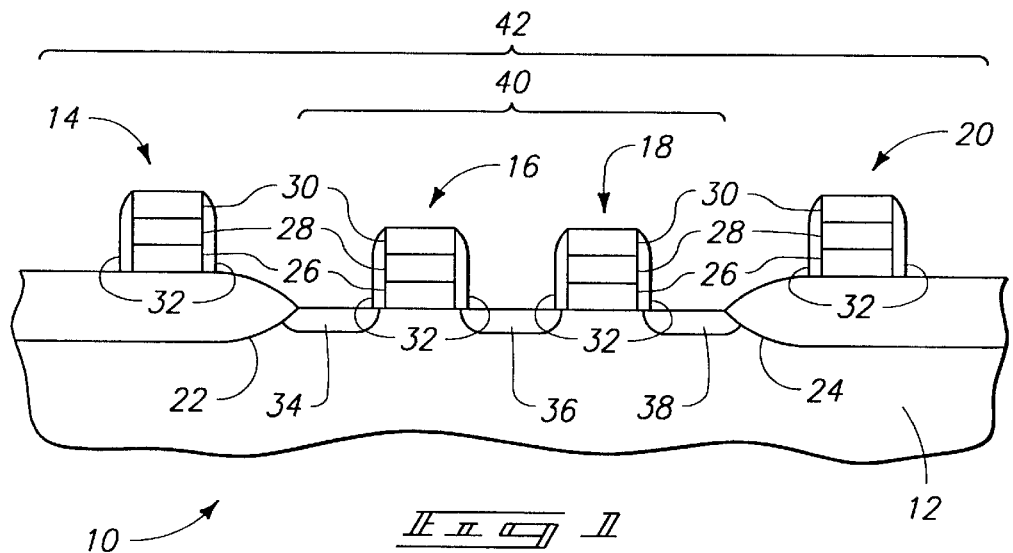
FIG. 1 is a cross-sectional view of a semiconductor wafer fragment at one processing step in accordance with the invention.

Referring to FIG. 1, a semiconductive substrate in process is indicated generally with reference number 10. Such is comprised of a bulk monocrystalline silicon substrate 12 having various layers deposited or otherwise formed thereover. In the context of this document, the term "semiconductive substrate" is defmed to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A plurality of conductive lines 14, 16, 18 and 20 are formed over substrate 10. In the depicted section conductive lines 14, 20 are formed over field oxide or field isolation regions 22, 24 respectively. Conductive lines 16, 18 are formed over a substrate active area 40. Conductive lines 14–20 are preferably anisotropically etched and include a polysilicon layer 26, a silicide layer 28 thereatop, and a suitable protective insulative capping layer 30 atop silicide layer 28. Suitable sidewall spacers 32 are formed over respective sidewalls of the conductive lines. Other conductive line constructions are possible. As so formed, conductive lines 14–20 are laterally spaced apart over substrate 10 and define therebetween respective diffusion regions or circuit nodes 34, 36 and 38 with which electrical connection is to be made.

A portion of a memory array area is designated generally by reference numeral 42. Such is defined relative to substrate 10 and comprises, in accordance with a preferred aspect of this invention, a portion of a DRAM memory array. The preferred DRAM memory array also includes a peripheral circuitry area which is operably associated with memory array area 42 and described in more detail below.

Figure 2:
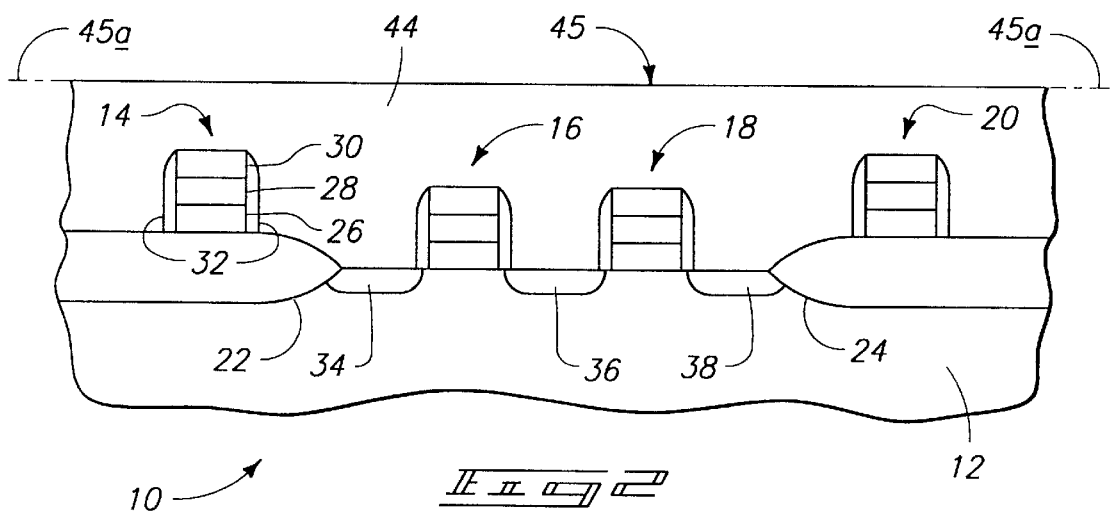
FIG. 2 is a cross-sectional view of the FIG. 1 semiconductor wafer fragment at a processing step subsequent to that shown by FIG. 1.

Referring to FIG. 2, a first layer 44 is formed over substrate 10. Layer 44 preferably comprises a first oxide layer of borophosphosilicate glass (BPSG). Layer 44 is subsequently planarized through mechanical abrasion of the substrate or a suitable dry etch. An exemplary implementation is chemical-mechanical planarization which effectively provides a generally planar first layer surface 45, the plane of which is diagrammatically indicated at 45a.

Figure 3:
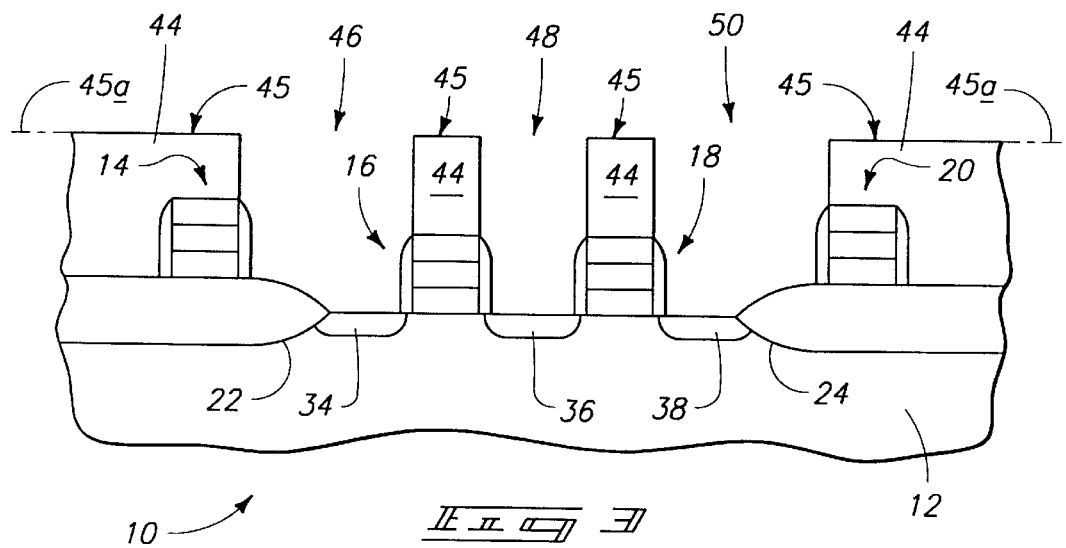
FIG. 3 is a cross-sectional view of the FIG. 1 semiconductor wafer fragment at a processing step subsequent to that shown by FIG. 2.

Referring to FIG. 3, first layer 44 is patterned and etched to form openings 46, 48 and 50 to respective circuit nodes 34, 36 and 38. Opening 46 is disposed between conductive lines 14, 16. Opening 48 is disposed between conductive lines 16, 18. Opening 50 is disposed between conductive lines 18, 20. Openings 46 and 50 define openings in which capacitor containers are to be formed. Opening 48 defines an opening in which a bit line contact is to be formed between the capacitor containers.

Figure 4:
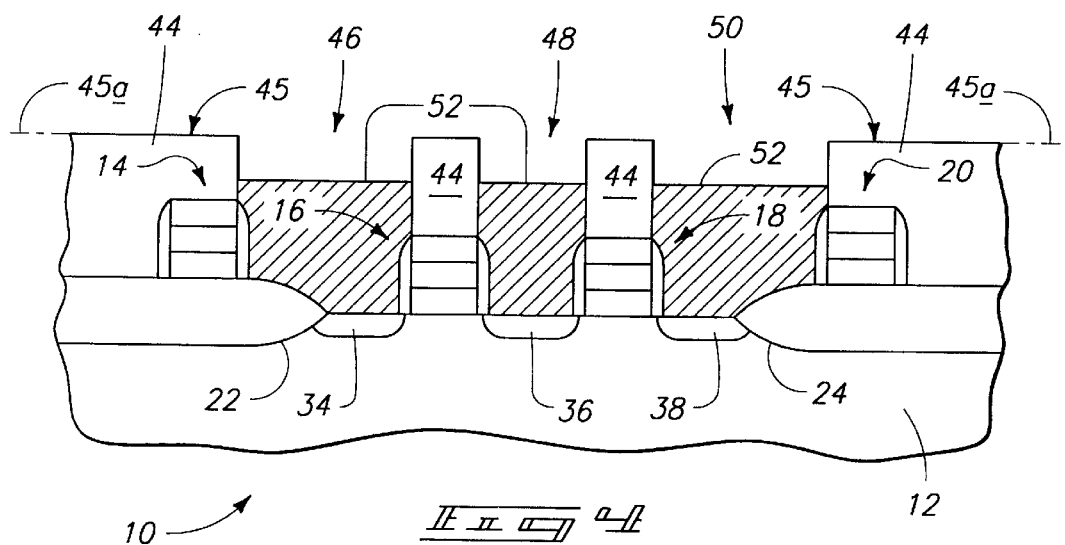
FIG. 4 is a cross-sectional view of the FIG. 1 semiconductor wafer fragment at a processing step subsequent to that shown by FIG. 3.

Referring to FIG. 4, a first material 52 is formed over substrate 10 and between the conductive lines. Preferably, such material is electrically conductive and is formed outwardly of and in electrical communication with respective circuit nodes 34, 36, and 38. Even more preferably, such material comprises a conductively doped silicon or polysilicon layer. According to one aspect of the invention, first material 52 is provided first to be substantially coplanar with planar first layer surface 45. Such is accomplished by first depositing material 52 and subsequently planarizing the material, as by suitable mechanical planarization or a dry etch so that it is coplanar with first layer surface 45. Subsequently, a wet etch of material 52 substantially selective to adjacent BPSG layer 44 can be conducted to clean the outwardly exposed surface of material 52 and to recess the material to a point below planar first layer surface 45 as shown.

Figure 11:
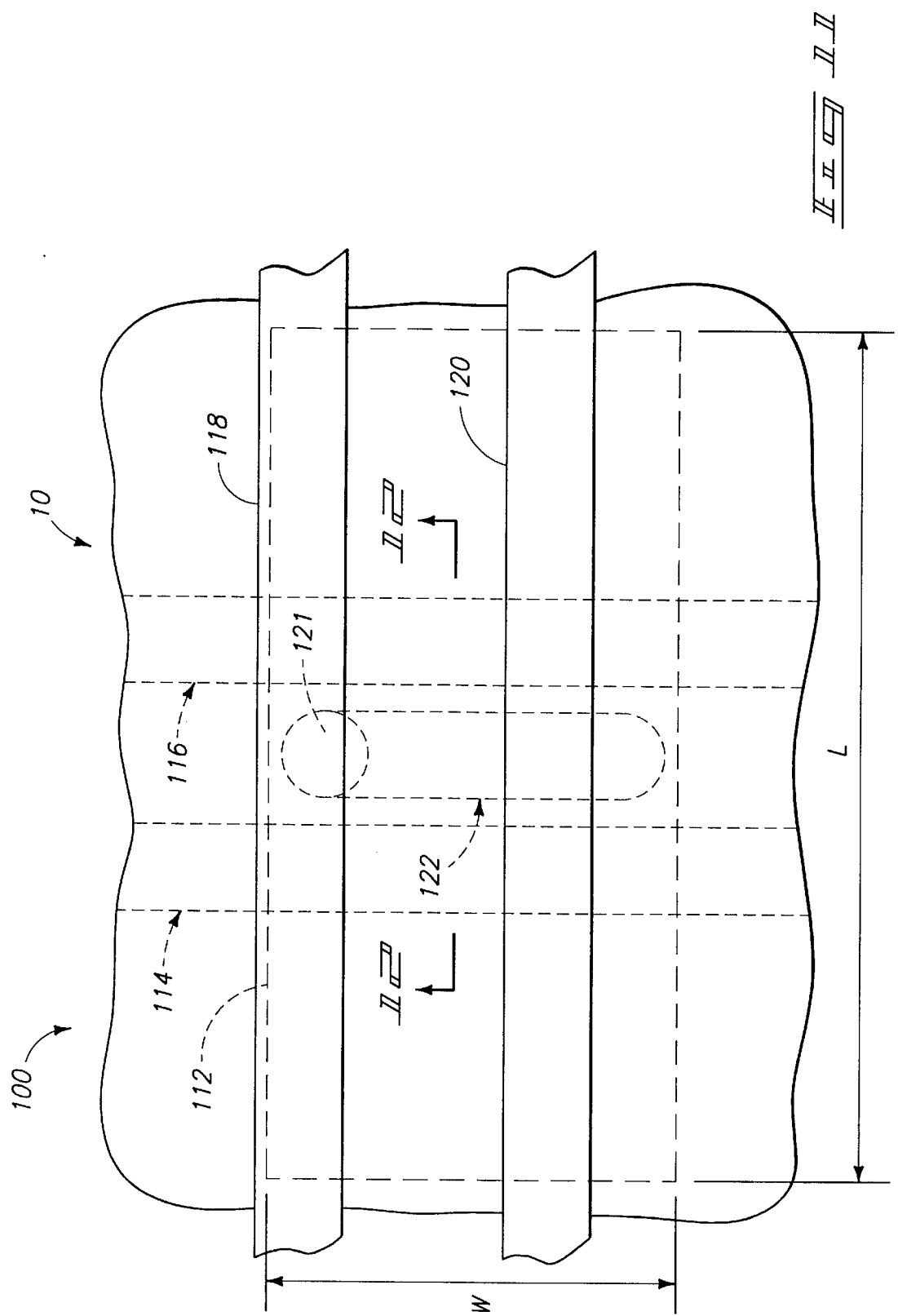
FIG. 11 is an enlarged plan view of a fragmentary portion of a peripheral circuitry area of a semiconductor wafer fragment at one processing step in accordance with the invention.

In connection with the above-mentioned peripheral circuitry area which comprises part of the preferred DRAM memory array, a preferred aspect of the invention will now be described with brief reference to FIGS. 11–13. FIG. 11 shows a fragmentary portion of a peripheral circuitry area at 100 which is formed relative to substrate 10. Peripheral circuitry area 100 includes at least one active contact area 112 (shown in dashed lines) formed thereover to which electrical connection is desired to be made relative to an elevationally higher conductive line. Area 112 defmes a length dimension L and a width dimension W and constitutes a location which is remote on the substrate relative to the memory array. In the illustrated example, two conductive lines 114, 116 are shown extending generally widthwise of area 112. Typically, such lines are overlaid by one or more layers such as an electrically insulative BPSG layer 44 (FIGS. 12, 13). Atop such layers, other conductive lines such as lengthwise-running lines 118, 120 are formed (FIG. 11). In this example, an electrical connection is desired between conductive line 118 and underlying active area 112. It is possible, however, to form a desired electrical connection as described below at a peripheral circuitry area location which is not between the illustrated conductive lines 114, 116. For example, such electrical connection can be made at an isolated peripheral circuitry area location.

According to one preferred implementation of the invention, a conductive peripheral line extension or elongated stringer 122 is formed to extend across a substantial portion of width dimension W. Line extension 122 is connected with line 118 via a contact 121. Preferably, line extension or stringer 122 comprises the same conductive material 52 (FIG. 4) which is also formed at the same time over memory array area 42. Such is more readily apparent with reference to FIG. 12, which is a view taken along line 12—12 in FIG. 11 and shows conductive material 52 formed between conductive lines 114, 116.

Figure 5:
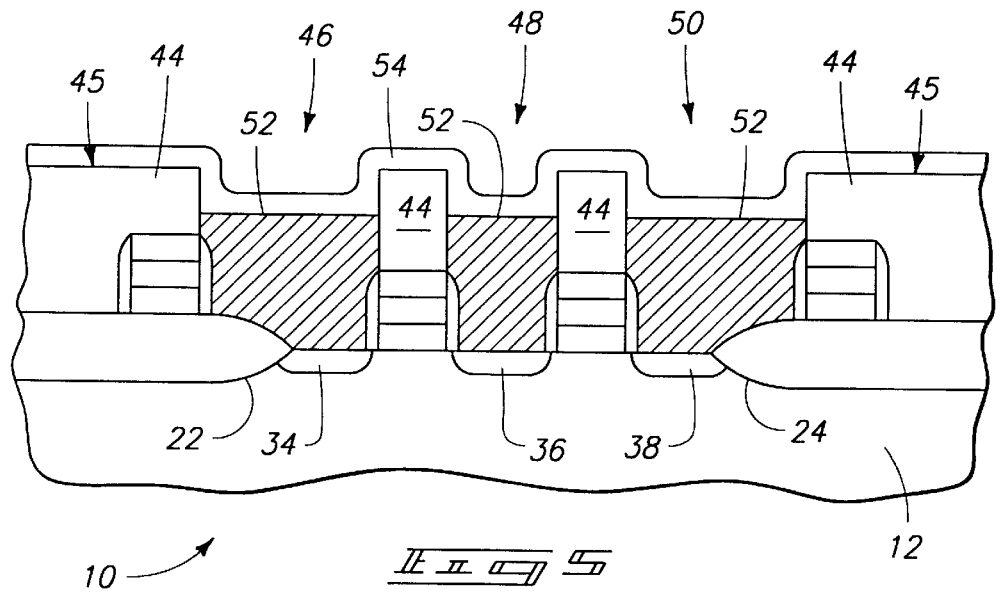
FIG. 5 is a cross-sectional view of the FIG. 1 semiconductor wafer fragment at a processing step subsequent to that shown by FIG. 4.

Referring to both FIGS. 5 and 12, a refractory metal layer 54 is formed over substrate 10 and the exposed outer surface of polysilicon layer 52. Exemplary refractory metals include titanium, cobalt, molybdenum and tantalum.

Figure 6:
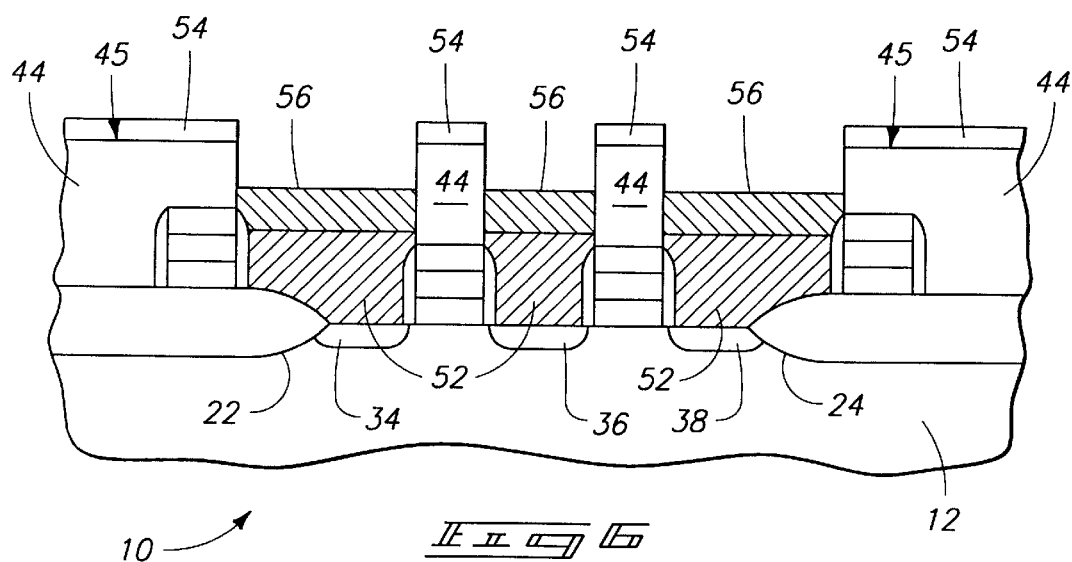
FIG. 6 is a cross-sectional view of the FIG. 1 semiconductor wafer fragment at a processing step subsequent to that shown by FIG. 5.

Referring to FIGS. 6 and 13, substrate 10 is subjected to conditions which are effective to form a silicide layer 56 atop remaining portions of first material 52. Silicide layer 56 defines a second conductive material which is formed over the first conductive material 52. Accordingly, the second conductive material is different from the first conductive material and is preferably more conductive than the first conductive material. In the preferred embodiment, silicide layer 56 comprises a silicide formed from a reaction between a refractory metal layer and the first conductive material (FIG. 5). With respect to line extension 122 (FIGS. 11 and 13), such comprises at least one conductive line which is formed over the peripheral circuitry area and which includes at least some of the silicide mentioned above.

Unreacted refractory metal layer 54 is subsequently stripped as by a suitable wet etch. An exemplary etch comprising $H_2O:H_2O_2:NH_4OH$ (5:1:1) suitably removes unreacted titanium while not etching the resultant silicide. Such etch also does not etch the BPSG layer (FIG. 6). Alternately, a plasma etch or suitable mechanical polishing can be used to remove the unreacted metal.

One of the advantages of the preferred line extension construction (extension 122 of FIGS. 11 and 13) is that such provides reduced resistance in the connection between line 118 and active area 112. This is most evident from FIG. 11 which shows that the line extension extends across a substantial entirety of the width dimension of the active area 112. Moreover, the preferred conductive extension construction has a reduced resistance due in part to the presence of the silicide component of the extension. Additionally in some circumstances, it is desirable to heavily dope the material from which extension 122 is formed. Such provides a source of dopants for the underlying active area with outdiffusion therefrom serving to dope the desired area, such as diffusion region 124 in FIGS. 12 and 13. However, such outdiffusion can also affect or impact peripheral transistor operation in a negative manner. The suicide component of the above described line extension effectively reduces undesirable outdiffusion elevationally outward relative to peripheral transistors and enables desirable outdiffusion to underlying active areas.

Referring to FIG. 7, and with the unreacted refractory metal having been suitably removed or stripped, a masking layer 60 is formed over the second conductive layer or silicide layer 56 and first insulative layer 44. Preferably, masking layer 60 comprises an insulative dielectric layer. Layers 52, 56 and 60 constitute a plurality of layers which are formed on or over substrate 10. In the illustrated and preferred embodiment, such layers are three in number and comprise different materials. Layer 56 constitutes a conductive layer which is elevationally interposed between an upper insulating layer 60 and a lower conductive layer 52. According to the implementation described in connection with FIGS. 11–13, an interposed layer 56 is also formed in at least one other substrate location, an exemplary location being between conductive lines 114, 116 of FIG. 13.

Referring to FIG. 8, a layer of photoresist 63 is formed over substrate 10 and suitably patterned as shown to form or define openings 62, 64.

Figure 9:
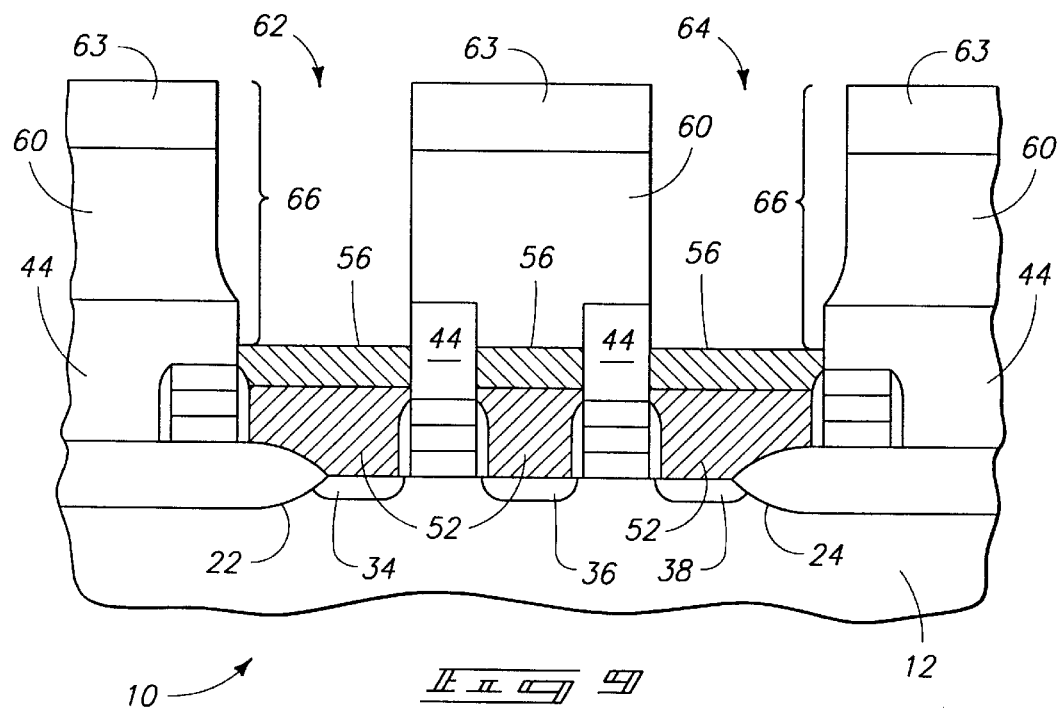
FIG. 9 is a cross-sectional view of the FIG. 1 semiconductor wafer fragment at a processing step subsequent to that shown by FIG. 8.
Figure 10:
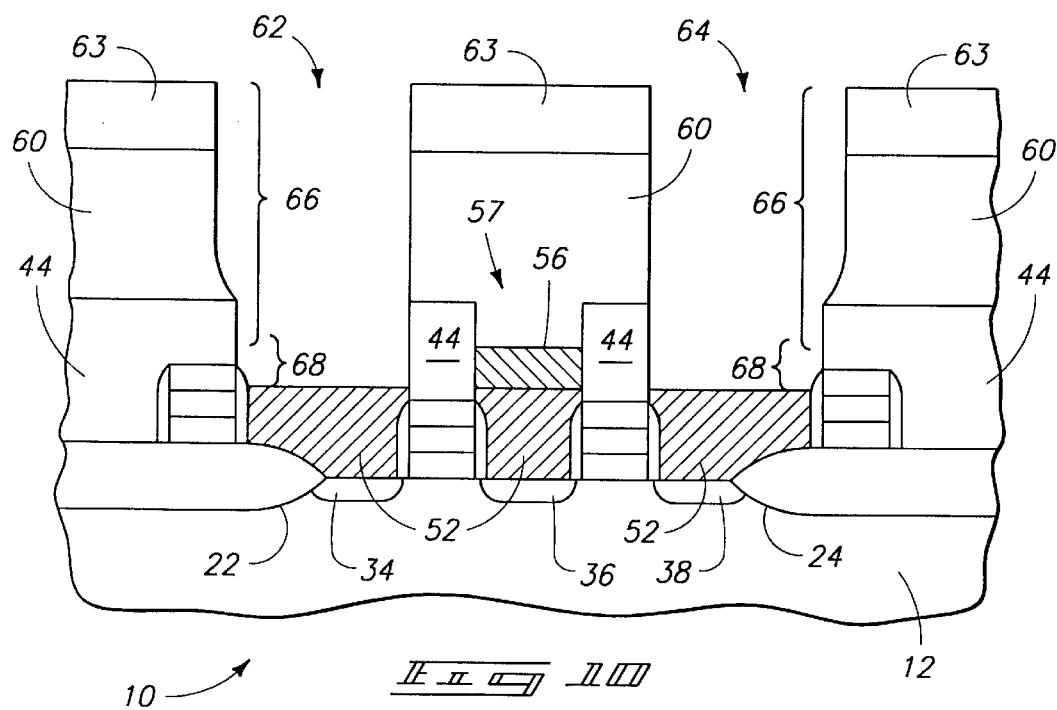
FIG. 10 is a cross-sectional view of the FIG. 1 semiconductor wafer fragment at a processing step subsequent to that shown by FIG. 9.

Referring to FIGS. 9 and 10, a plurality of capacitor container openings 62, 64 are etched through layer 60 (FIG. 9) and layer 56 (FIG. 10) in accordance with a preferred aspect of the invention. For purposes of the ongoing discussion, layer 60 comprises a first material and layer 56 comprises a second material which is different from the first material. The etching of these layers or materials in the manner set forth just below enables capacitors to be formed in a manner which alleviates concerns associated with undesirable variances in capacitance values which stem, in part, from the above described prior art timed etch.

Referring now specifically to FIG. 9, a first of the materials, here unmasked portions of layer 60 elevationally below openings 62, 64, is etched to a degree sufficient to outwardly expose at least some, and preferably all, of the outer upper surface of silicide layer 56 (the second of the materials). Such forms a first part 66 of desired capacitor containers. According to a preferred implementation, such etch comprises a first etching composition or chemistry which, upon detection of and responsive to the outward exposure of layer 56, is changed to a second etching composition or chemistry which is different from the first etching composition or chemistry. Subsequently, and through use of such second etching composition or chemistry, the second of the materials, here unmasked portions of layer 56 elevationally below first capacitor container part 66, is etched as shown in FIG. 10 to a degree sufficient to outwardly expose at least a portion, and preferably substantially all, of an upper outer surface of material 52. Such forms a second part 68 of desired capacitor containers. For purposes of this discussion, remaining material 52 comprises a third material a portion of which is outwardly exposed by the second etching composition or chemistry. Further, such third material is preferably electrically conductive and forms an electrical connection with conductively doped semiconductor material of the substrate.

Alternately considered, an etch is conducted through masking layer 60 substantially selective relative to the second conductive material 56 (FIG. 9). Accordingly, an upper insulating layer is etched or removed substantially selective relative to interposed conductive layer 56 to form capacitor container first portion 66. Such etch is preferably conducted to a degree sufficient to outwardly expose elevationally lower layer 56. According to a preferred aspect of the invention, masking layer 60 is etched downwardly using a first etch chemistry with an oxide component suitable for etching the BPSG material from which layer 60 is formed. Preferably, such etch is conducted to degree which is sufficient to outwardly expose at least a surface of silicide layer 56. Such exposure is subsequently detected, such as by chemically detecting silicide material, whereupon the etch chemistry is changed to one which is suitable for etching underlying or elevationally lower layer 56. FIG. 10 shows the resultant etch of elevationally lower layer 56 (FIG. 9). As so etched, second conductive material 56 is etched through capacitor container first portions 66 and respective openings 62, 64 substantially selective relative to remaining first material 52. Preferably, such etch outwardly exposes the first conductive material.

According to one aspect of the invention, such etch is conducted to be substantially selective relative to the first conductive material. According to another aspect of the invention, such outward exposure of the first conductive material can be detected and the second etch can be terminated. Such second etch preferably comprises etching the interposed conductive layer 56 substantially selective relative to the lower conductive layer 52 to form capacitor container second portions 68. Subsequently, after formation of the preferred capacitor containers, a third electrically conductive material 70 is formed in respective openings 62, 64 as shown in FIG. 14, and forms an electrical connection with material 52. Such comprises a further processing step in which suitable capacitor storage nodes are formed within and relative to the above described capacitor containers. Subsequent processing to form suitable capacitors can now take place in accordance with conventional semiconductor processing methods such as those which are incorporated by reference above or with methods to be developed in the future. The peripheral circuitry areas of FIGS. 11–13 can be masked during the above processing.

Intermediate the formed capacitor containers, a composite stack of conductive material forms a buried contact interconnecting plug or layer 57 (FIGS. 10 and 14). Such plug layer is constituted by an inner conductive polysilicon portion (the middle one of remaining layer 52) which is disposed elevationally below insulating dielectric layer 60 and adjacent node location 36. Accordingly, plug 57 includes an outer silicide portion 56 which is formed atop or over the inner conductive portion. As shown and in accordance with a preferred aspect of the invention, at least one and preferably two capacitor container contacts (respective remaining portions of layer 52) are disposed, one on either side of the middle layer 52.

In accordance with another preferred implementation, the above described FIG. 11 peripheral line extension or conductive extension 122 is formed from the same material and preferably during the same processing steps from and during which the buried contact interconnecting plug layer is formed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Memory integrated circuitry comprising:
    a memory array area and a peripheral circuitry area operably associated with one another, the memory array area comprising a buried contact interconnecting plug formed through an insulating dielectric layer, the plug comprising an inner conductive polysilicon material portion disposed over a conductive substrate node location, the inner conductive polysilicon portion being in conductive electrical connection with the conductive substrate node location, and a silicide material portion formed atop the inner conductive portion; and
    the peripheral circuitry area comprising a peripheral line extension electrically interconnecting substrate active area with a conductive peripheral line, the peripheral line extension being at least in part formed from the polysilicon material and the silicide material of the buried contact interconnecting plug, the peripheral line extension being longer than it is wide.

2. The memory integrated circuitry of claim 1 wherein the memory array comprises DRAM.

3. The memory integrated circuitry of claim 1 wherein the memory array comprises DRAM, and the interconnecting plug comprises a bit line contact plug.

4. The memory integrated circuitry of claim 1 wherein the peripheral line extension extends in a direction generally perpendicular to the conductive peripheral line.

5. The memory integrated circuitry of claim 1 further comprising another conductive peripheral line immediately adjacent said conductive peripheral line, the peripheral line extension underlying at least a portion of the another conductive peripheral line width.

6. The memory integrated circuitry of claim 1 further comprising another conductive peripheral line immediately adjacent said conductive peripheral line, the peripheral line extension underlying all of the another conductive peripheral line width.

7. The memory integrated circuitry of claim 1 wherein the peripheral line extension underlies a portion of the width of said conductive peripheral line.

8. The memory integrated circuitry of claim 1 wherein the peripheral line extension underlies only a portion of the width of said conductive peripheral line.

9. The memory integrated circuitry of claim 1 wherein,
    the peripheral line extension underlies only a portion of the width of said conductive peripheral line; and
    further comprising another conductive peripheral line immediately adjacent said conductive peripheral line, the peripheral line extension underlying at least a portion of the another conductive peripheral line width.

10. The memory integrated circuitry of claim 1 wherein,
    the peripheral line extension underlies only a portion of the width of said conductive peripheral line; and
    further comprising another conductive peripheral line immediately adjacent said conductive peripheral line, the peripheral line extension underlying all of the another conductive peripheral line width.

11. The memory integrated circuitry of claim 1 wherein,
    the peripheral line extension underlies only a portion of the width of said conductive peripheral line;
    further comprising another conductive peripheral line immediately adjacent said conductive peripheral line, the peripheral line extension underlying all of the another conductive peripheral line width; and
    the peripheral line extension extends in a direction generally perpendicular to said conductive peripheral line and the another conductive peripheral line.

12. A memory integrated circuit comprising:
a memory array area and a peripheral circuitry area operably associated with one another, the memory array area comprising:
a substrate;
a plurality of circuit nodes formed at the surface of the substrate;
a plurality of insulated conductive lines formed between adjacent pairs of the plurality of circuit nodes;
an insulating dielectric formed on the surface of the substrate and atop the plurality of insulated conductive lines and the plurality of circuit nodes;
a buried contact interconnecting plug formed through the insulating dielectric layer, the plug comprising an inner conductive polysilicon material portion disposed over one of the plurality of nodes, the inner conductive polysilicon portion being in conductive electrical connection with the node, and an outer silicide material portion formed atop the inner conductive portion; and
the peripheral circuitry area comprising:
a conductive peripheral line;
a peripheral line extension formed within the insulating dielectric and electrically contacting an active area formed on the substrate, the peripheral line extension being at least in part formed from the polysilicon material and the silicide material of the buried contact interconnecting plug, the peripheral line extension being longer than it is wide; and
a contact formed at a juncture of the conductive peripheral line and the peripheral line extension and electrically interconnecting them.

13. The memory integrated circuitry of claim 12 wherein the memory array comprises DRAM.

14. The memory integrated circuitry of claim 12 wherein the memory array comprises DRAM, and the interconnecting plug comprises a bit line contact plug.

15. The memory integrated circuitry of claim 12 wherein the peripheral line extension extends in a direction generally perpendicular to the conductive peripheral line.

16. The memory integrated circuitry of claim 12 further comprising another conductive peripheral line immediately adjacent said conductive peripheral line, the peripheral line extension underlying at least a portion of the another conductive peripheral line width.

17. The memory integrated circuitry of claim 12 further comprising another conductive peripheral line immediately adjacent said conductive peripheral line, the peripheral line extension underlying all of the another conductive peripheral line width.

18. The memory integrated circuitry of claim 12 wherein the peripheral line extension underlies a portion of the width of said conductive peripheral line.

19. The memory integrated circuitry of claim 12 wherein the peripheral line extension underlies only a portion of the width of said conductive peripheral line.

20. The memory integrated circuitry of claim 12 wherein,
the peripheral line extension underlies only a portion of the width of said conductive peripheral line; and
further comprising another conductive peripheral line immediately adjacent said conductive peripheral line, the peripheral line extension underlying at least a portion of the another conductive peripheral line width.

21. The memory integrated circuitry of claim 12 wherein,
the peripheral line extension underlies only a portion of the width of said conductive peripheral line; and
further comprising another conductive peripheral line immediately adjacent said conductive peripheral line, the peripheral line extension underlying all of the another conductive peripheral line width.

22. The memory integrated circuitry of claim 12 wherein,
the peripheral line extension underlies only a portion of the width of said conductive peripheral line;
further comprising another conductive peripheral line immediately adjacent said conductive peripheral line, the peripheral line extension underlying all of the another conductive peripheral line width; and
the peripheral line extension is longer than it is wide, and extends is in a direction generally perpendicular to said conductive peripheral line and the another conductive peripheral line.

* * * * *

UNITED STATES PATENT AND TRADEMARK OFFICE
CERTIFICATE OF CORRECTION

PATENT NO.    : 6,175,146 B1                                         Page 1 of 1
DATED         : January 16, 2001
INVENTOR(S)   : Richard H. Lane and John K. Zahurak It is certified that error appears in the above-identified patent and that said Letters Patent is hereby corrected as shown below:

Column 3,
Line 59, delete the word "defmed" and insert -- defined --.

Column 4,
Line 67, delete the word "defmes" and insert -- defines --.

Signed and Sealed this

Tenth Day of May, 2005

JON W. DUDAS
*Director of the United States Patent and Trademark Office*